United States Patent
Grupp et al.

(10) Patent No.: US 7,219,316 B2
(45) Date of Patent: May 15, 2007

(54) MULTI-VALUED OR SINGLE STRENGTH SIGNAL DETECTION IN A HARDWARE DESCRIPTION LANGUAGE

(75) Inventors: Richard J. Grupp, Milton, VT (US); Craig M. Monroe, South Burlington, VT (US); Raymond W. Schuppe, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 642 days.

(21) Appl. No.: 10/605,747

(22) Filed: Oct. 23, 2003

(65) Prior Publication Data

US 2005/0091636 A1 Apr. 28, 2005

(51) Int. Cl.
*G06F 17/50* (2006.01)
*G06F 9/45* (2006.01)
*G06F 9/44* (2006.01)

(52) U.S. Cl. .......................... 716/5; 717/107; 717/114
(58) Field of Classification Search .................. 716/3, 716/4, 5; 717/107, 114
See application file for complete search history.

(56) References Cited

U.S. PATENT DOCUMENTS

| | | | |
|---|---|---|---|
| 3,633,100 A | 1/1972 | Hellwell et al. | |
| 4,527,249 A | 7/1985 | Van Brunt | |
| 4,628,471 A | 12/1986 | Schuler et al. | |
| 4,821,173 A | 4/1989 | Young et al. | |
| 5,051,911 A | 9/1991 | Kimura et al. | |
| 5,327,361 A | 7/1994 | Long et al. | |
| 5,345,401 A | 9/1994 | Tani | |
| 5,883,809 A * | 3/1999 | Sullivan et al. | 716/3 |
| 6,035,115 A | 3/2000 | Suzuki | |
| 6,263,301 B1 | 7/2001 | Cox et al. | |
| 6,285,975 B1 | 9/2001 | Nair et al. | |
| 6,370,493 B1 | 4/2002 | Knapp et al. | |
| 6,639,438 B2 * | 10/2003 | Glenn et al. | 327/154 |
| 6,879,949 B2 * | 4/2005 | Scherr | 703/14 |
| 6,959,271 B1 * | 10/2005 | Ballam | 703/14 |

FOREIGN PATENT DOCUMENTS

JP 2001051025 A 2/2001

* cited by examiner

*Primary Examiner*—Thuan Do
*Assistant Examiner*—Magid Y. Dimyan
(74) *Attorney, Agent, or Firm*—Richard M. Kotulak; Hoffman, Warnick & D'Alessandro LLC (57) ABSTRACT

A method, module, and program product for detecting signal strengths in a hardware description language, such as Verilog, that does not provide for such detection. The method includes the steps of creating a wired net configuration that provides for a data input signal and a controlled reference signal; varying the controlled reference signal based on a desired signal strength to be detected; and comparing the input signal with the controlled reference signal to determine if the desired signal strength has been detected.

17 Claims, 10 Drawing Sheets

| DATA_IN | a_out | b_out | IS_L |
|---|---|---|---|
| "L"[1] | 1 | 0 | 1 |
| strong0 | X | 0 | 0 |
| supply0 | 0 | 0 | 0 |
| any strength logic 1 | 1 | 1 | 0 |
| <=pullx | 1 | X | 0 |
| >=strongx | X | X | 0 |
| Hi-Z | 1 | X | 0 |

[1]"L" is defined as any logic 0 of the following strengths: pull0, large0, weak0, medium0, or small0

| DATA_IN | a_out | b_out | IS_L |
|---|---|---|---|
| "L"[1] | 1 | 0 | 1 |
| strong0 | X | 0 | 0 |
| supply0 | 0 | 0 | 0 |
| any strength logic 1 | 1 | 1 | 0 |
| <=pullx | 1 | X | 0 |
| >=strongx | X | X | 0 |
| Hi-Z | 1 | X | 0 |

[1]"L" is defined as any logic 0 of the following strengths: pull0, large0, weak0, medium0, or small0

FIG. 3

Verilog HDL example code for "LDETECT" module

```
module LDETECT (IS_L, DATA_IN);
  output IS_L;
  input DATA_IN;

nmos  nm1  (a_out,DATA_IN,1'b1);
  buf   b1   (a_out,1'b1);     //drive & compare with Strong1 buf   b2   (b_out,DATA_IN);

wire  preIS_L = ({a_out,b_out}  === 2'b10);
  buf   b3   (IS_L, preIS_L);

endmodule
```

| DATA_IN | a_out | b_out | IS_H |
|---|---|---|---|
| any strength logic 0 | 0 | 0 | 0 |
| "H"[1] | 0 | 1 | 1 |
| strong1 | X | 1 | 0 |
| supply1 | 1 | 1 | 0 |
| <=pullx | 0 | X | 0 |
| >=strongx | X | X | 0 |
| Hi-Z | 0 | X | 0 |

[1]"H" is defined as any logic 1 of the following strengths: pull1, large1, weak1, medium1, or small1

Verilog HDL example code for "HDETECT" module

```verilog
module HDETECT (IS_H, DATA_IN);
  output IS_H;
  input DATA_IN;

nmos  nm1  (a_out,DATA_IN,1'b1);
  buf   b1   (a_out,1'b0);    //drive & compare with Strong0 buf   b2   (b_out,DATA_IN);

wire  preIS_H = ({a_out,b_out} === 2'b01);
  buf   b3   (IS_H, preIS_H);

endmodule
```

FIG. 7

PULL0DETECT

FIG. 8

| DATA_IN | a_out | b_out | IS_PULL0 |
|---|---|---|---|
| <=large0 | 1 | 0 | 0 |
| pull0 | X | 0 | 1 |
| >=strong0 | 0 | 0 | 0 |
| any strength logic 1 | 1 | 1 | 0 |
| <=largex | 1 | X | 0 |
| >=pullx | X | X | 0 |
| Hi-Z | 1 | X | 0 |

FIG. 9

Verilog HDL example code for "PULL0DETECT" module

```
module PULL0DETECT (IS_PULL0, DATA_IN);
  output IS_PULL0;
  input DATA_IN;

nmos  nm1  (a_out,DATA_IN,1'b1);
  //drive & compare with pull1
  buf    (highz0,pull1) b1   (a_out,1'b1);

buf    b2   (b_out,DATA_IN);

wire   preIS_PULL0 = ({a_out,b_out} === 2'bx0);
  buf    b3   (IS_PULL0, preIS_PULL0);

endmodule
```

| DATA_IN | a_out | b_out | IS_PULL1 |
|---|---|---|---|
| any strength logic 0 | 0 | 0 | 0 |
| <=large1 | 0 | 1 | 0 |
| pull1 | X | 1 | 1 |
| >=strong1 | 1 | 1 | 0 |
| <=largex | 0 | X | 0 |
| >=pullx | X | X | 0 |
| Hi-Z | 0 | X | 0 |

FIG. 12

Verilog HDL example code for "PULL1DETECT" module

```
module PULL1DETECT (IS_PULL1, DATA_IN);
  output IS_PULL1;
  input DATA_IN;

nmos   nm1  (a_out,DATA_IN,1'b1);
  //drive & compare with pull0
  buf    (pull0,highz1) b1    (a_out,1'b0);

buf    b2   (b_out,DATA_IN);

wire   preIS_PULL1 = ({a_out,b_out} === 2'bx1);
  buf    b3   (IS_PULL1, preIS_PULL1);

endmodule
```

FIG. 13

Example IO: Driver Truth Table    130

|   | A | TS | DI | PAD | PADN |
|---|---|----|----|-----|------|
| a | - | 0  | -  | L[1] | L[1] |
| b | - | -  | 0  | L[1] | L[1] |
| c | - | 1  | 1  | A   | not-A |

[1]"L" in this example refers to a pull strength logic0.
Also known as "pull0".

FIG. 14

Example IO: Receiver Truth Table    140

|   | PAD | PADN | RG | Z |
|---|-----|------|----|----|
| d | 0   | 1    | 1  | 0 |
| e | 1   | 0    | 1  | 1 |
| f | 1   | 1    | 1  | X |
| g | 0   | 0    | 1  | X |
| h | L[1] | L[1] | 1  | 0 |
| i | L[1] | 0    | 1  | X |
| j | L[1] | 1    | 1  | X |
| k | 0   | L[1] | 1  | X |
| l | 1   | L[1] | 1  | X |
| m | -   | -    | 0  | 0 |

[1]"L" in this example refers to pull strength logic 0.
Also known as "pull0".

FIG. 15

Verilog HDL example code for modeling "Example IO" truth tables above

```
module Example_IO (PAD,PADN,Z,A,TS,DI,RG);
    inout  PAD, PADN;                                          /150
    output Z;
    input  A, TS, DI, RG;
    tri    outBuf, outBufN;
    wire   bufCtrl, isPadPull0, isPadNPull0, muxSel1, muxOut1, muxOut2;

//Driver section
    and    a1    (bufCtrl,TS,DI);
    not    n1    (A_,A);

bufif1    bf1    (outBuf, A, bufCtrl);
    bufif1    bf2    (outBufN, A_,bufCtrl);
    pulldown  d1     (outBuf);
    pulldown  d2     (outBufN);
    nmos      nm1    (PAD, outBuf, 1'b1);
    nmos      nm2    (PADN, outBufN,1'b1);

//Receiver section
    PULL0DETECT  pd1  (isPadPull0, PAD);    //Reference Fig. 9 for PULL0DETECT
                                                    module definition
    PULL0DETECT  pd2  (isPadNPull0,PADN); //Reference Fig. 9 for PULL0DETECT
                                                    module definition
    xnor    xn1    (muxSel1,PAD,PADN);
    //MUX21 port order: Mux_Out, Data_Sel, D0, D1
    MUX21*  mx1   (muxOut1,muxSel1,PAD,1'bx);
    //MUX41 port order: Mux_Out, Data_Sel(MSB), Data-Sel(LSB), D00, D01, D10, D11
    MUX41*  mx2   (muxOut2,isPadPull0,isPadNPull0,muxOut1,1'bx,1'bx,1'b0);

and     a2     (Z,muxOut2,RG);
endmodule
```

*NOTE that the "MUX21" and "MUX41" instances in the Verilog code above are
not shown modeled here for this example, but are industry standard 2:1 and
4:1 Multiplexers, respectively. They are not standard "built-in" Verilog
primitives, but are easily implemented in Verilog either via behavioral
code or by UDP primitive tables.

MULTI-VALUED OR SINGLE STRENGTH SIGNAL DETECTION IN A HARDWARE DESCRIPTION LANGUAGE

BACKGROUND OF INVENTION

1. Technical Field

The present invention is related to hardware description languages. More particularly, the present invention provides multi-level or single strength signal detection in a hardware description language (HDL), such as Verilog, that does not easily provide for such detection.

2. Related Art

The current Verilog core standard does not provide any way to test for the specific strength of a signal. One solution to this problem is the use of the Verilog Programming Language Interface (PLI) standard. As known in the art, PLI provides a mechanism for interfacing Verilog programs with programs written in the C language, and for accessing the internal databases of a Verilog simulator from a C program. PLI is used for implementing system calls which would have been hard to do otherwise (or impossible) using the Verilog syntax. To this extent, PLI provides a way to extend the functionality of a given Verilog simulator that supports the PLI (as described in the IEEE 1364-1995 Verilog standards document).

A major drawback to using the PLI is that it is very cumbersome. To test the specific strength of a signal, for example, a C compiler is needed, and a custom C function must be written to perform the signal strength detection. The custom C function must then be linked (statically or dynamically) with a user's specific Verilog simulation tool executable, and then the user's Verilog HDL must be coded to make use of the newly written PLI routine.

There is a need, therefore, for a reusable Verilog module that is capable of performing signal strength detection.

SUMMARY OF INVENTION

The present invention provides a reusable Verilog module that is capable of performing signal strength detection. Specifically, use is made of Verilog's standard strength resolution capabilities as they relate to wired net configurations to "compare" a given input signal with a controlled reference signal of fixed strength. The controlled reference signal will vary depending on the desired signal strength that a user would like to detect.

One advantage of the present invention is ease of use and simplicity as compared to the cumbersome and far more complicated PLI method. The present invention simply requires that a user incorporate a predefined module into their Verilog code when they require signal strength detection functionality. This is no different than any other call to a hierarchical "building block" function that may be written for a given design. Thus, the present invention is much more convenient and user-friendly than the prior art PLI solution.

A first aspect of the present invention is directed to a method for detecting signal strengths in a hardware description language that does not provide for such detection, comprising: creating a wired net configuration that provides for a data input signal and a controlled reference signal; varying the controlled reference signal based on a desired signal strength to be detected; and comparing the input signal with the controlled reference signal to determine if the desired signal strength has been detected.

A second aspect of the present invention is directed to a module for detecting signal strengths in a hardware description language that does not provide for such detection, the module comprising: a first wired net for receiving an input signal and a controlled reference signal, wherein the hardware description language resolves the first wired net to obtain a resolved value; a scalar net for receiving a signal corresponding to the input signal; and a comparison system for comparing the resolved value on the first wired net with the signal corresponding to the input signal on the scalar net to determine if the desired signal strength has been detected.

A third aspect of the present invention is directed to a program product stored on a recordable medium for detecting signal strengths, comprising: program code for providing a first wired net for receiving an input signal and a controlled reference signal and for resolving the first wired net to obtain a resolved value; program code for providing a scalar net for receiving a signal corresponding to the input signal; and program code for comparing the resolved value on the first wired net with the signal corresponding to the input signal on the scalar net to determine if the desired signal strength has been detected.

A fourth aspect of the present invention is directed to a reusable module for detecting signal strengths in Verilog, the reusable module comprising: a first wired net for receiving an input signal and a controlled reference signal, wherein the hardware description language resolves the first wired net to obtain a resolved value; a scalar net for receiving a signal corresponding to the input signal; and a comparison system for comparing the resolved value on the first wired net with the signal corresponding to the input signal on the scalar net to determine if the desired signal strength has been detected, wherein the desired signal strength is selected from the group consisting of: supply0, strong0, pull0, large0, weak0, medium0, small0, supply1, strong1, pull1, large1, weak1, medium1, small1, and ranges of signal strengths.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
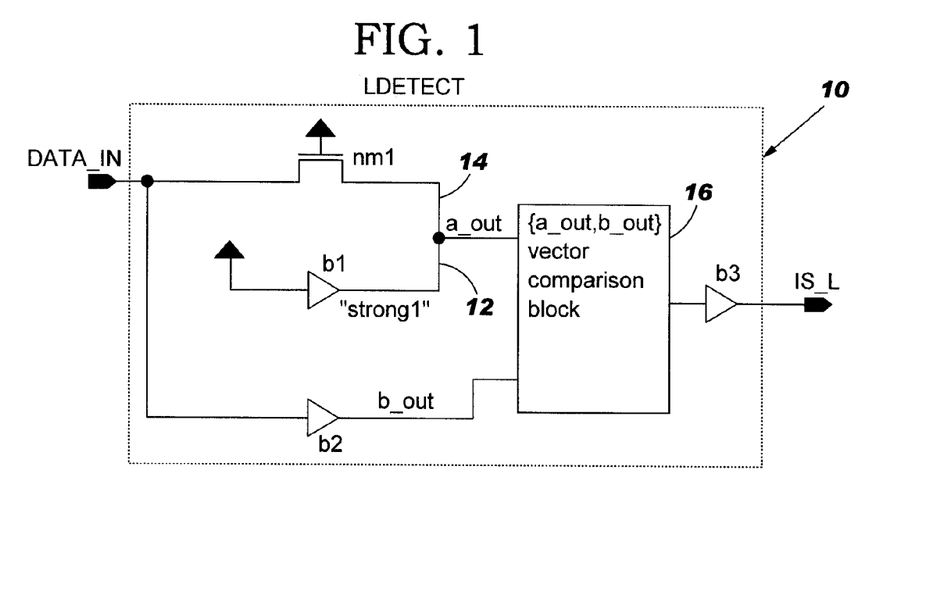
FIG. 1 illustrates an LDETECT circuit for detecting a data input signal DATA_IN having strength L in accordance with the present invention, wherein L is a logic 0 signal having a signal strength in the range of "small0" up to "pull0."
Figure 2:
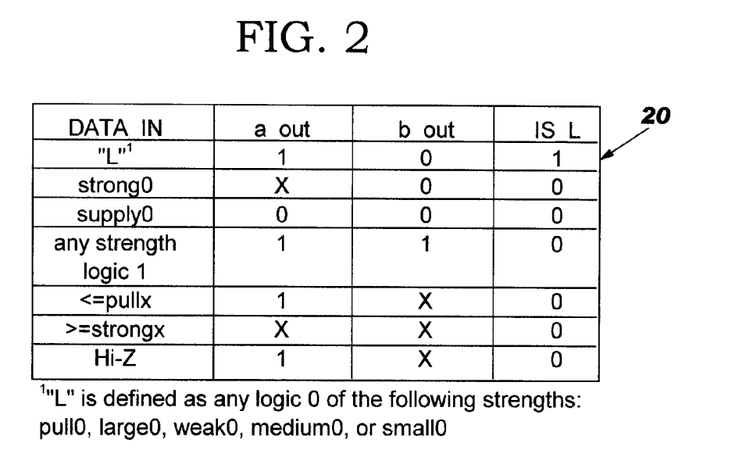
FIG. 2 is a truth table illustrating the output IS_L of the LDETECT circuit of FIG. 1, for all possible input values of the data input signal DATA_IN.
Figure 3:
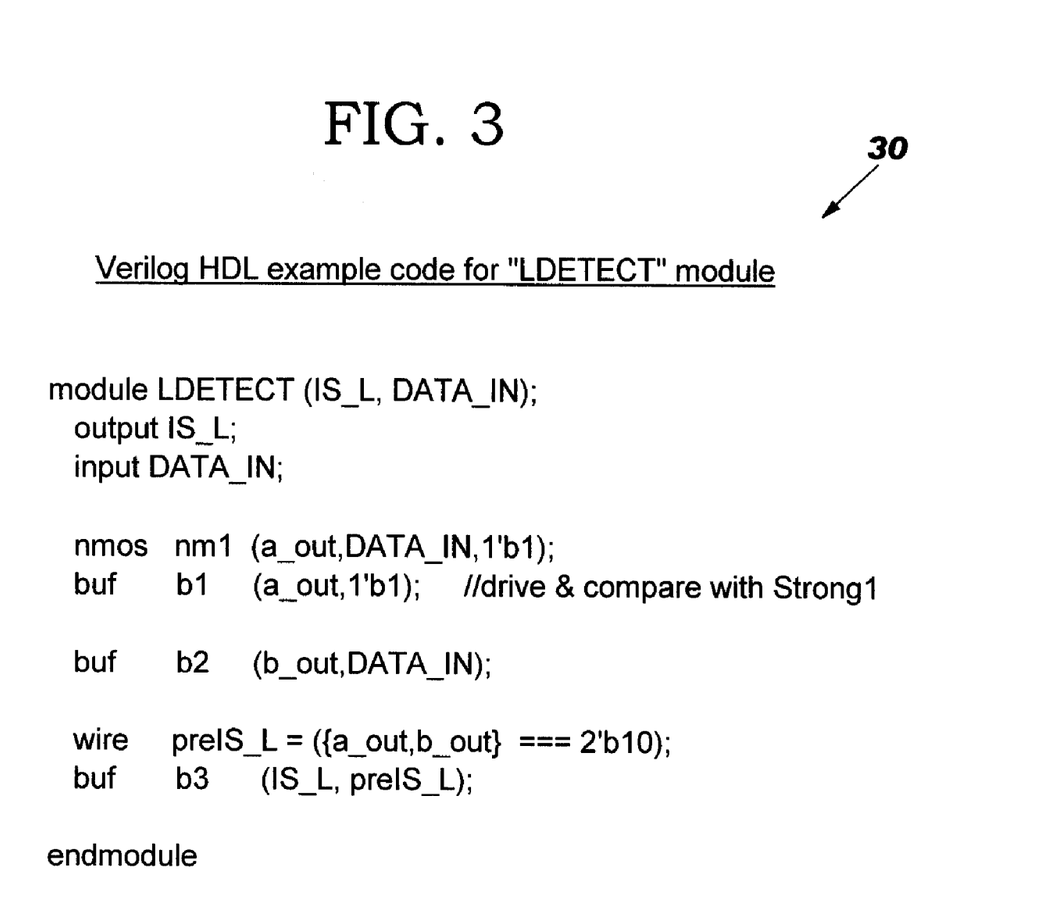
FIG. 3 illustrates a reusable Verilog module corresponding to the LDTETCT circuit of FIG. 1.

There are only 4 logic values in Verilog, including: 0, 1, X, and Z (also known as hi-Z). Each of these values (except for Z which, by definition, is a signal that has zero strength) has a specific signal strength associated with it. The default strength is "strong," in the absence of a signal strength being specified. Logic 0 and logic 1, as well as X (indeterminate) can have any of the following strengths, in ascending strength order: highz (no strength, or Z), small, medium, weak, large, pull, strong, and supply. For example, a logic 0 signal that is of "weak" strength would be referenced as "weak0," while a logic 1 signal that is of "strong" strength would be referenced as "strong1." In a first embodiment of the present invention, a logic 0 signal having a signal strength in the range of "small0" up to "pull0" is detected. In this embodiment, as illustrated in FIGS. 1–3, a logic 0 signal having a range of signal strengths from "small0" up to "pull0" is referenced as L. A circuit 10 (LDETECT) for detecting a data input signal DATA_IN having a signal strength L is illustrated in FIG. 1. A reusable Verilog module 30 corresponding to the LDETECT circuit 10 of FIG. 1 is shown in FIG. 3. A truth table 20 illustrating the output IS_L of the LDETECT circuit 10 for all possible input values of the data input signal DATA_IN is shown in FIG. 2. Also shown in the truth table 20 are the resultant values of the a_out and b_out nets in the LDETECT circuit 10.

As shown in FIG. 1, the data input signal DATA_IN is fed into a unidirectional, isolating, nmos gate nm1, whose control input (i.e., gate) is tied to Vdd (i.e., logic 1). The nmos gate nm1 does not alter the strength of the data input signal DATA_IN in any way. A controlled reference signal 12 having a "strong1" signal strength is generated via a standard Verilog buffer gate (instance b1) whose input is tied to Vdd. The output of buffer b1 has a "strong" value because, as known in the art, the output of any logic gate in Verilog has a "strong" value. The controlled reference signal 12 (i.e., "strong1") and the output 14 of the nmos gate nm1 (i.e., the data input signal DATA_IN) are driven into the a_out net.

The a_out net is a standard "wired net" configuration in Verilog. As known in the art, Verilog uses a standard set of rules for signal strength resolution to resolve the value that it places on a wired net, such as the a_out net. These strength resolution rules are documented clearly in most any Verilog reference manual, including the IEEE 1364-1995 Verilog standards specification, and will not be described in detail herein.

Referring to FIG. 2, the resultant, "resolved" values on the a_out net of FIG. 1 are listed in the truth table 20 for all possible input values of the data input signal DATA_IN. For example, as shown in row 1 of the truth table 20, the value on the a_out net is equal to logic 1 when a data input signal DATA_IN having a signal strength L is driven into the a_out net along with a controlled reference signal 12 having a signal strength of "strong1." This occurs because the signal strength "strong1" is greater than the signal strength L in the absolute value sense.

The b_out net is derived simply by buffering the data input signal DATA_IN using another standard Verilog buffer gate (instance b2). If the data input signal DATA_IN is a logic 0 signal of any strength (i.e., L, "strong0", or "supply0"), then b_out=0. As detailed above, this occurs because the output of any logic gate in Verilog is a "strong" value. In general, b_out is a "strong" version of the data input signal DATA_IN. The a_out and b_out nets are then compared to a predetermined vector value ("key combination") in a vector comparison block 16.

FIG. 3 shows an example of a reusable Verilog module 30 corresponding to the LDETECT circuit 10 of FIG. 1. In this example, the vector comparison block 16 is coded with the following statement in Verilog:

wire preIS_L=({a_out,b_out}===2'b10).

This is a standard "continuous assignment" statement in Verilog that returns one of only two possible values: 0 (false) or 1 (true). It returns 1 (true) if and only if the combined signals (as a vector) of {a_out,b_out} are equal to "10." This is an efficient way of determining the case where a_out=1 and b_out=0 (i.e., the signal strength of the data input signal DATA_IN=L).

The truth table 20 in FIG. 2 shows all possible input values for the data input signal DATA_IN (both logic values and associated strengths), and the values of the resultant a_out/b_out nets from the LDETECT circuit 10 of FIG. 1. It can be seen from the truth table 20 that there is only one unique combination of a_out/b_out (i.e., "10") that describes, and hence uniquely detects, a data input signal DATA_IN having a signal strength L.

The output of the above-described "continuous assignment" statement is subsequently buffered using another standard Verilog buffer gate (instance b3) to drive the output signal IS_L. The output buffer b3 is used in case Verilog needs to assign interconnect delays to the reusable Verilog module 30. In such a case, a Verilog gate, such as a buffer, is required on the output stage of the module 30.

Figure 4:
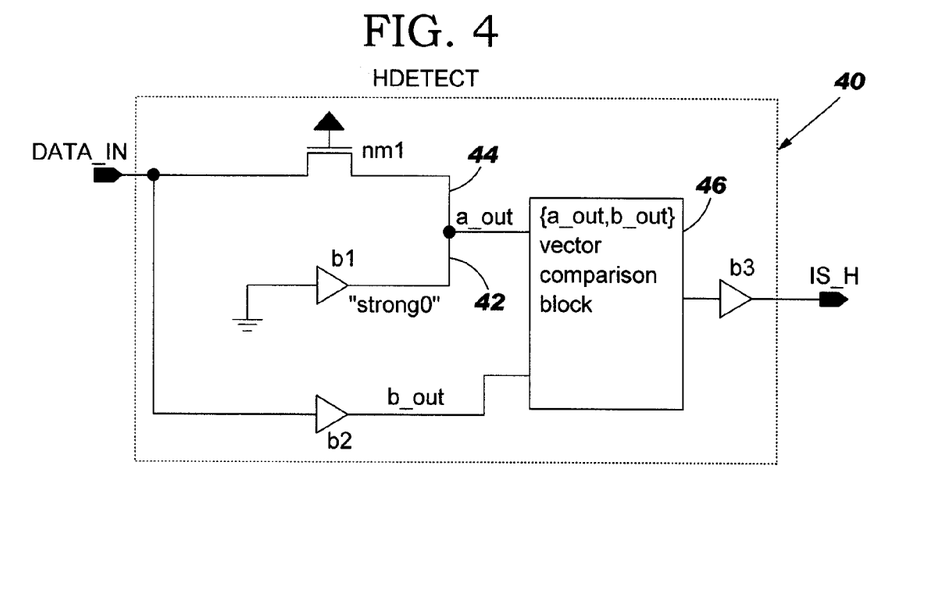
FIG. 4 illustrates an HDETECT circuit for detecting a data input signal DATA_IN having strength H in accordance with the present invention, wherein H is a logic 1 signal having a range of signal strengths from "small1" up to "pull1."
Figure 5:
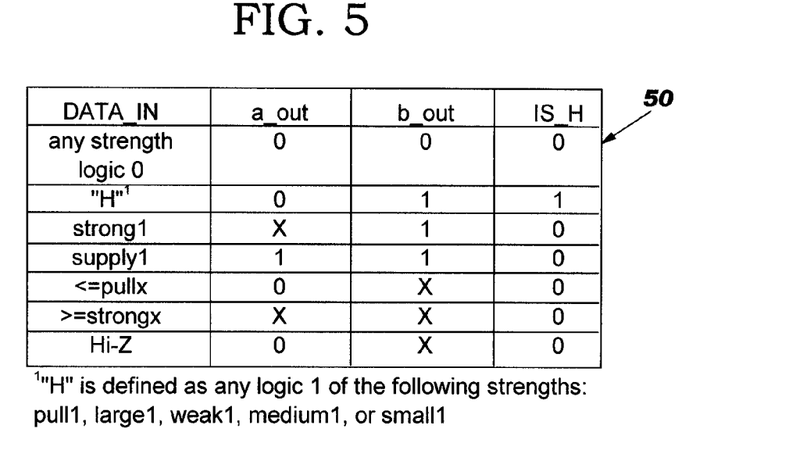
FIG. 5 is a truth table illustrating the output IS_H of the HDETECT circuit of FIG. 4, for all possible input values of the data input signal DATA_IN.
Figure 6:
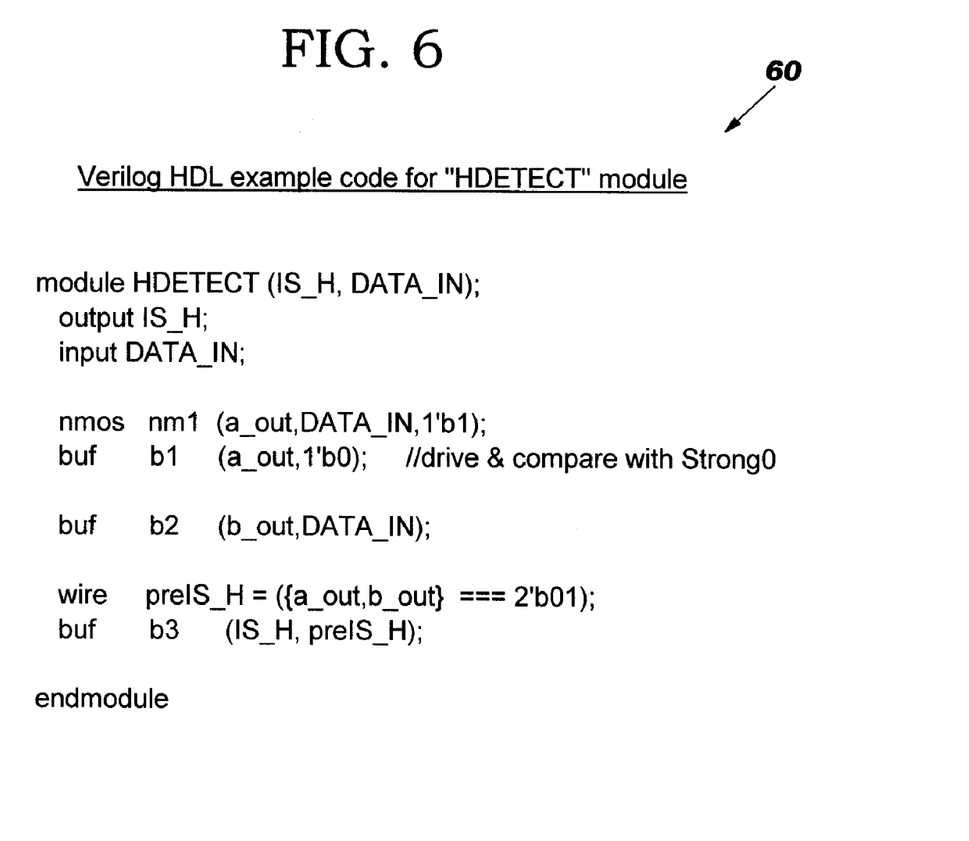
FIG. 6 illustrates a reusable Verilog module corresponding to the HDTETCT circuit of FIG. 4.

In a second embodiment of the present invention, a logic 1 signal having a signal strength in the range of "small1" up to "pull1" is detected. In this embodiment, as illustrated in FIGS. 4–6, a logic 1 signal having a range of signal strengths from "small1" up to "pull1" is referenced as H. A circuit 40 (HDETECT) for detecting a data input signal DATA_IN having strength H is illustrated in FIG. 4. A reusable Verilog module 60 corresponding to the HDE-TECT circuit 40 of FIG. 4 is shown in FIG. 6. A truth table 50 illustrating the output IS_H of the HDETECT circuit 40 for all possible input values of the data input signal DATA_IN is shown in FIG. 5. Also shown in the truth table 50 are the resultant values of the a_out and b_out nets in the HDETECT circuit 40.

As shown in FIG. 4, the data input signal DATA_IN is fed into a unidirectional, isolating, nmos gate nm1 whose control input is tied to Vdd. As detailed above, the nmos gate nm1 does not alter the signal strength of the data input signal DATA_IN in any way. A controlled reference signal 42 having a "strong0" signal strength is generated via a standard Verilog buffer gate (instance b1), whose input is tied to ground. The controlled reference signal 42 (i.e., "strong0") and the output 44 of the nmos gate nm1 (i.e., the data input signal DATA_IN) are driven into the a_out net.

Referring to FIG. 5, the resultant values on the a_out net of FIG. 4 are listed in the truth table 50 for all possible input values of the data input signal DATA_IN. For example, as shown in row 2 of the truth table 50, the value on the a_out net is equal to 0 when a data input signal DATA_IN having a signal strength H is driven into the a_out net along with a "strong0." This occurs because the signal strength "strong0" is greater the signal strength H in the absolute value sense.

The b_out net is derived by buffering the data input signal DATA_IN using another standard Verilog buffer gate (instance b2). If the data input signal DATA_IN is a logic 1 signal of any strength (i.e., H, "strong1", or "supply1"), then b_out=1. In general, b_out is a "strong" version of the data input signal DATA_IN. The a_out and b_out nets are then compared to a predetermined vector value in a vector comparison block 46.

FIG. 6 shows an example of a reusable Verilog module 60 corresponding to the HDETECT circuit 10 of FIG. 4. In this example, the vector comparison block 46 is coded with the following statement in Verilog:

wire preIS_H=({a_out,b_out}===2'b01).

This "continuous assignment" statement returns 1 if and only if the combined signals (as a vector) of {a_out,b_out} are equal to "01." This is an efficient way of determining the case where a_out=0 and b_out=1 (i.e., the signal strength of the data input signal DATA_IN=H).

The truth table 50 in FIG. 5 shows all possible input values for the data input signal DATA_IN (both logic values and associated strengths), and the values of the resultant a_out/b_out nets from the HDETECT circuit 40 of FIG. 4. It can be seen from the truth table 50 that there is only one unique combination of a_out/b_out (i.e., "01") that describes, and hence uniquely detects, a data input signal DATA_IN having a signal strength H. The output of the "continuous assignment" statement is subsequently buffered using another standard Verilog buffer gate (instance b3) to drive the output signal IS_H. Comparing FIGS. 1 and 4, it should be noted that the only differences between the LDETECT and HDETECT circuits 10, 40, are the values of the controlled reference signals 12, 42 ("strong1" vs. "strong0" and the resultant {a_out,b_out} key combinations ("10" vs. "01"). In FIG. 1, for example, a data input signal DATA_IN having a signal strength L is detected using a controlled reference signal 12 having a signal strength "strong1." In FIG. 4, a data input signal DATA_IN having a signal strength H is detected using a controlled reference signal 42 having a signal strength "strong0." In these two cases, the controlled reference signals 12, 42, each comprise a signal having a "strong" signal strength ("strong1" or "strong0") that is "logically opposite" to the range of signals strength (L or H) to be detected.

The LDETECT circuit 10 and HDETECT circuit 40 are each used to detect a signal having a range of signal strengths at a given logic value. The present invention, however, may also be used to detect a signal having a specific logic value and signal strength.

Figure 7:
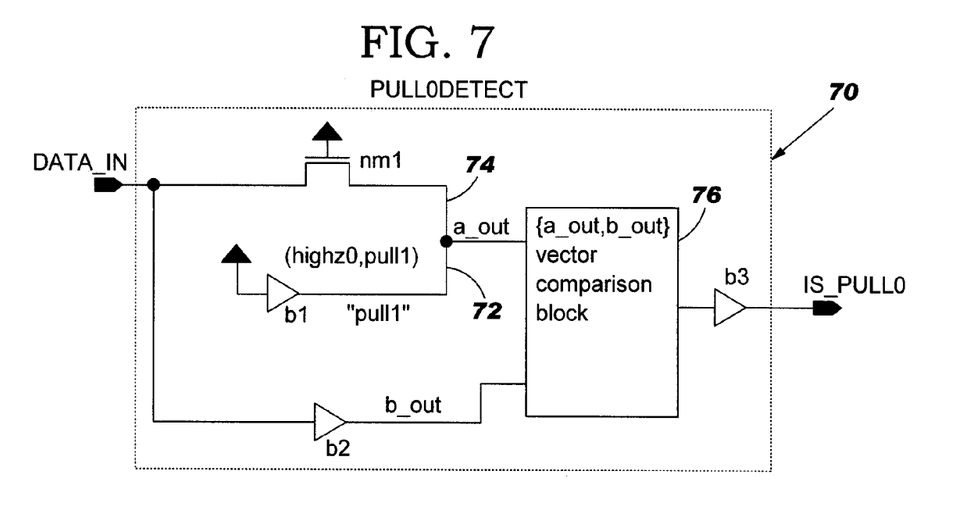
FIG. 7 illustrates a PULLODETECT circuit for detecting a data input signal DATA_IN having strength "pull0" in accordance with the present invention.
Figure 8:
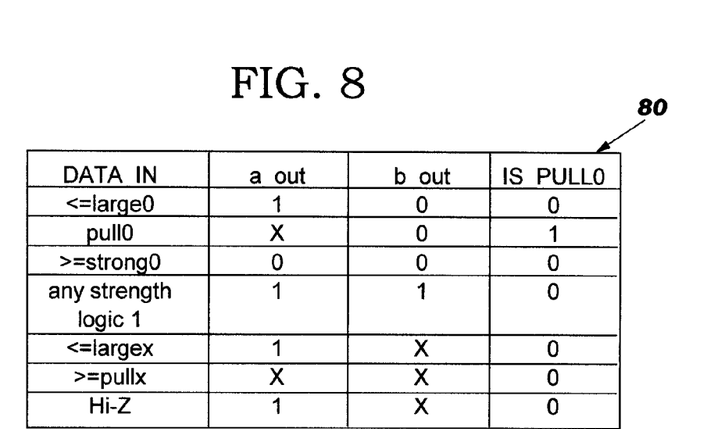
FIG. 8 is a truth table illustrating the output IS_PULL0 of the PULL0DETECT circuit of FIG. 7, for all possible input values of the data input signal DATA_IN.
Figure 9:
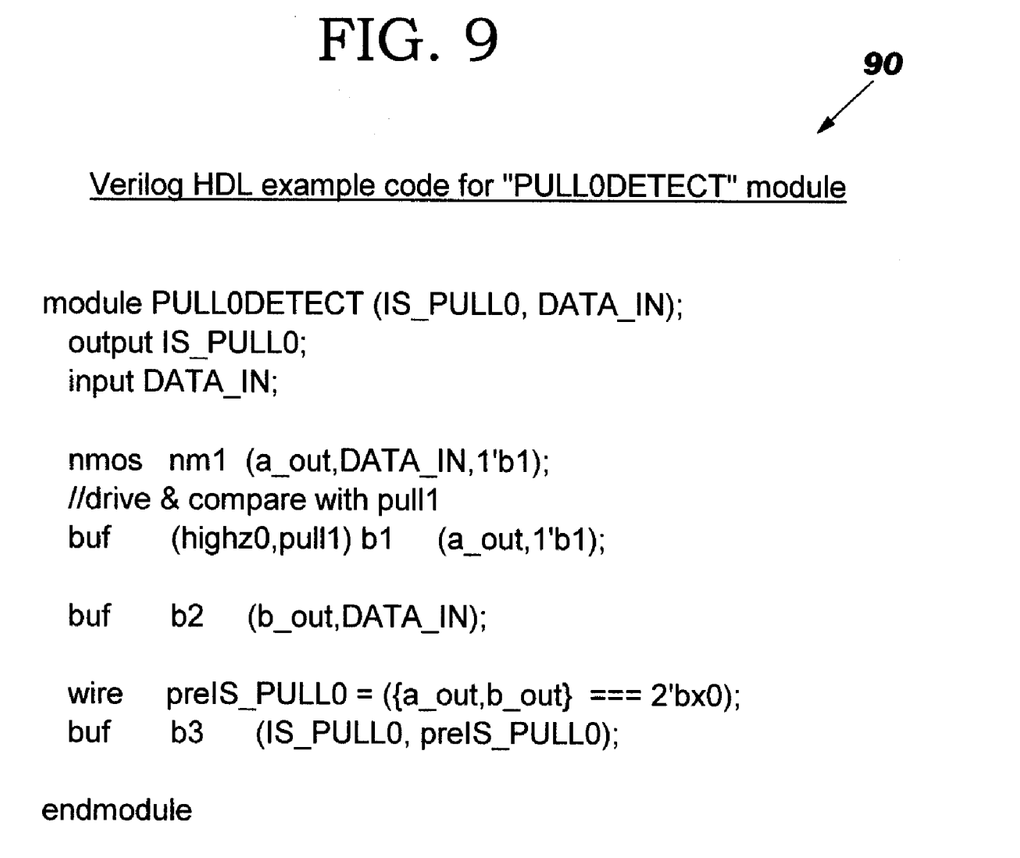
FIG. 9 illustrates a reusable Verilog module corresponding to the PULL0DTETCT circuit of FIG. 7.

Referring now to FIG. 7, there is illustrated a circuit 70 (PULL0DETECT) for detecting a data input signal DATA_IN having a logic 0 value with a "pull0" signal strength. A reusable Verilog module 90 corresponding to the PULL0DETECT circuit 70 of FIG. 7 is shown in FIG. 9. A truth table 80 illustrating the output IS_PULL0 of the PULL0DETECT circuit 70 for all possible input values of the data input signal DATA_IN is shown in FIG. 8. Also shown in the truth table 80 are the resultant values of the a_out and b_out nets in the PULL0DETECT circuit 70. In this embodiment of the present invention, buffer b1 outputs a controlled reference signal 72 having a logic value and signal strength (i.e., "pull1") that is exactly opposite to the signal strength to be detected (i.e., "pull0"). This is achieved by tying the input of buffer b1 to Vdd and, in the Verilog module 90, assigning a "pull1" strength to the output of buffer b1 using the Verilog "buf" logic gate with drive strength specifications:

buf (highz0,pull1) b1 (a_out,1'b1).

The data input signal DATA_IN is fed into a unidirectional, isolating, nmos gate nm1 whose control input is tied to Vdd. The controlled reference signal 72 (i.e., "pull1") and the output 74 of the nmos gate nm1 (i.e., the data input signal DATA_IN) are driven into the a_out net. The resultant values on the a_out net of FIG. 7 are listed in the truth table 80 for all possible input values of the data input signal DATA_IN. For example, as shown in row 2 of the truth table 80, the value on the a_out net is equal to X (indeterminate) when a data input signal DATA_IN having a signal strength "pull0" is driven into the a_out net along with a controlled reference signal 72 having a signal strength of "pull1." The X logic value is generated because the "pull0" signal strength of the data input signal DATA_IN is equal to the "pull1" signal strength of the controlled reference signal 72 in the absolute value sense.

The b_out net is derived by buffering the data input signal DATA_IN using another standard Verilog buffer gate (instance b2). The a_out and b_out nets are then compared to a predetermined vector value in a vector comparison block 76.

FIG. 9 shows an example of a reusable Verilog module 90 corresponding to the PULL0DETECT circuit 70 of FIG. 7. In this example, the vector comparison block 76 is coded with the following statement in Verilog:

wire preIS_PULL0=({a_out,b_out}===2'bx0).

This "continuous assignment" statement returns 1 if and only if the combined signals (as a vector) of {a_out,b_out} are equal to "X0." The truth table 80 in FIG. 8 shows all possible input values for the data input signal DATA_IN (both logic values and associated strengths), and the values of the resultant a_out/b_out nets from the PULL0DETECT circuit 70 of FIG. 7. It can be seen from the truth table 80 that there is only one unique combination of a_out/b_out (i.e., "X0") that describes, and hence uniquely detects, a data input signal DATA_IN having a signal strength "pull0". The output of the "continuous assignment" statement is subsequently buffered using another standard Verilog buffer gate (instance b3) to drive the output signal IS_PULL0.

Figure 10:
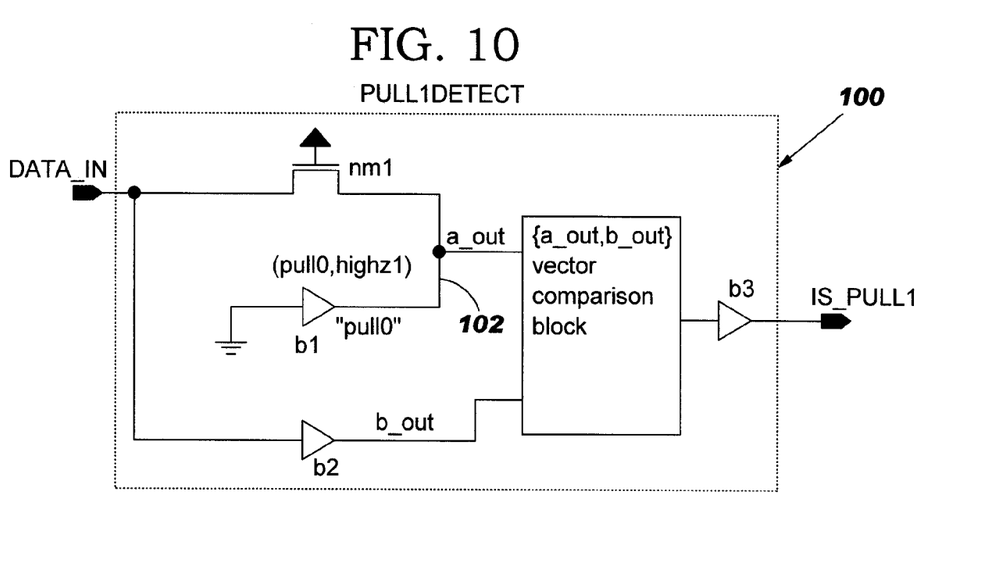
FIG. 10 illustrates a PULL1DETECT circuit for detecting a data input signal DATA_IN having strength "pull1" in accordance with the present invention.
Figure 11:
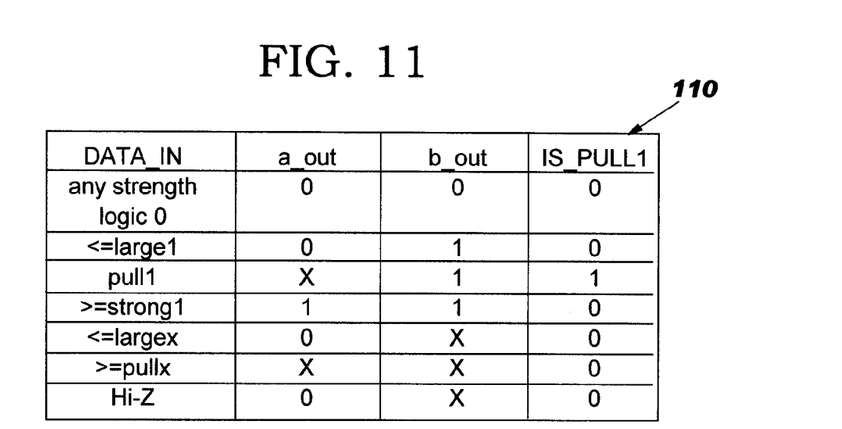
FIG. 11 is a truth table illustrating the output IS_PULL1 of the PULL1DETECT circuit of FIG. 10, for all possible input values of the data input signal DATA_IN.
Figure 12:
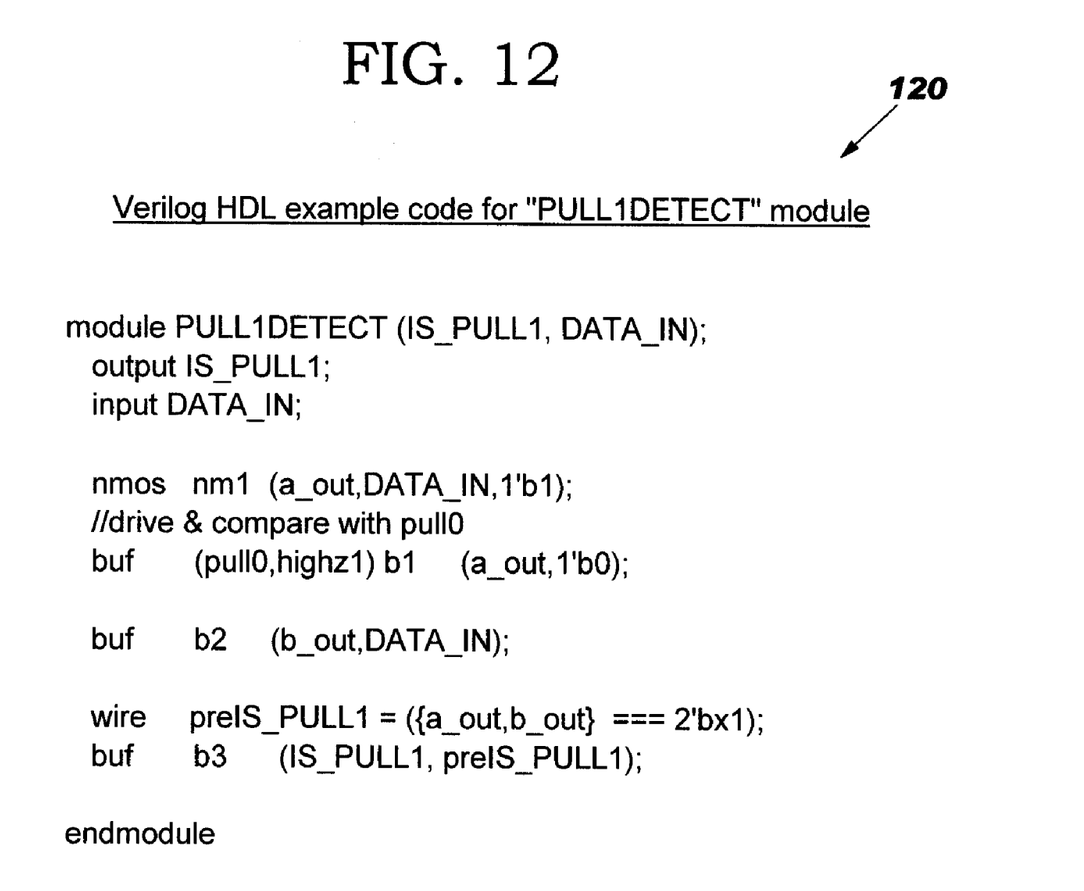
FIG. 12 illustrates a reusable Verilog module corresponding to the PULL1DTETCT circuit of FIG. 10.

The analogous case of a circuit 100 (PULL1DETECT) for detecting a data input signal DATA_IN having a logic 1 value with a "pull1" signal strength is illustrated in FIG. 10. The corresponding truth table 110 and a reusable Verilog module 120 are shown in FIGS. 11 and 12, respectively. In this embodiment of the present invention, the controlled reference signal 102 has a signal strength of "pull0." The "pull0" value is provided by tying the input of buffer b1 to ground and, in the Verilog module 120, assigning a "pull0" signal strength to the output of buffer b1 using the Verilog "buf" logic gate with drive strength specifications:

buf (pull0,highz1) b1(a_out,1'b0).

Figure 13:
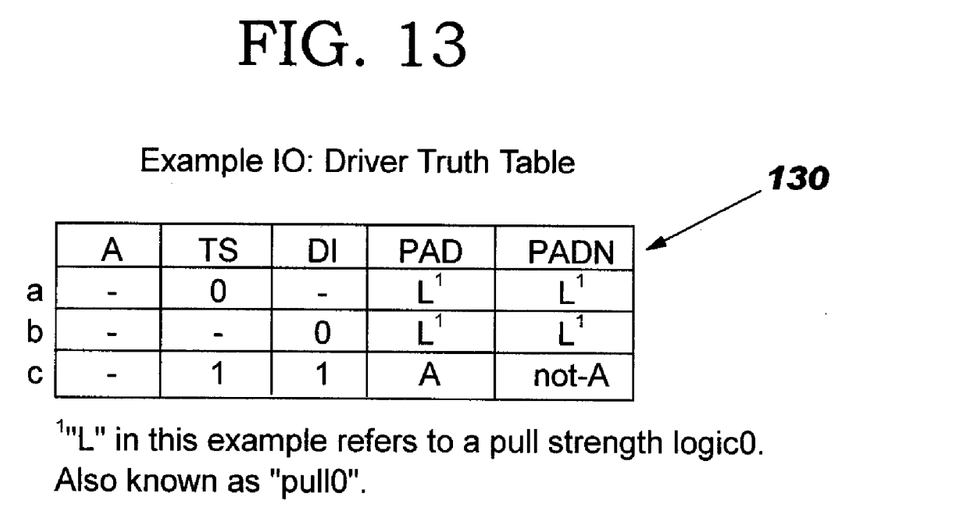
FIG. 13 is a driver truth table for a differential I/O.
Figure 14:
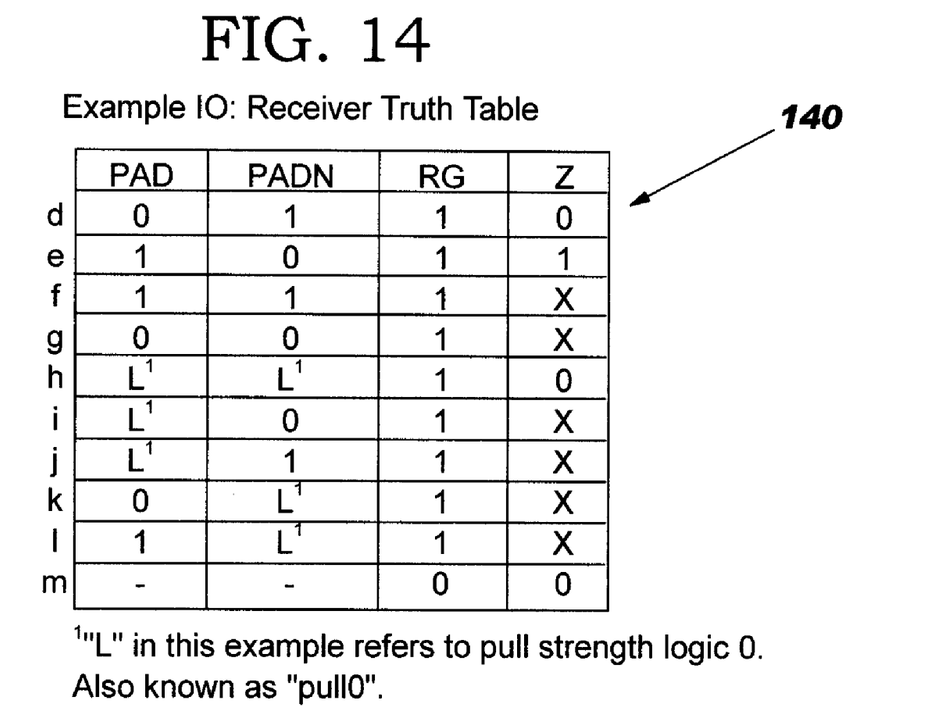
FIG. 14 is a receiver truth table for the differential I/O.
Figure 15:
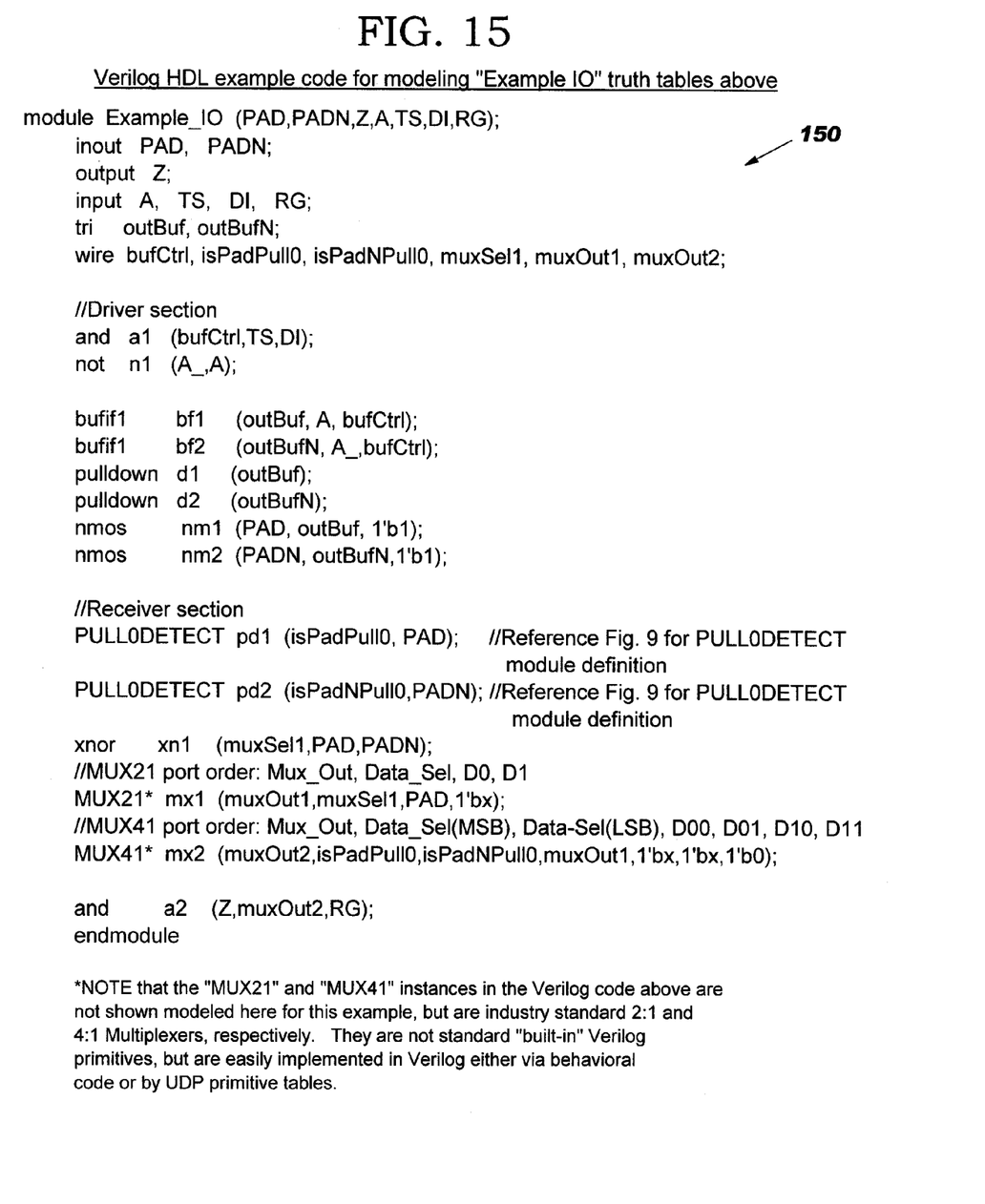
FIG. 15 illustrates the use of a PULL0DETECT module to model the receiver portion of the differential I/O described in FIG. 14.

As can be inferred from the above embodiments, the present invention can be easily extended to create "detectors" for any given range of strength values, or any given single, specific logic strength value. There are many possible uses for this invention. One example use is in the area of analog-to-digital (A/D) or digital-to-analog (D/A) conversion in the digital (e.g., Verilog) realm. Intermediate voltages could be represented as varying signal strengths in Verilog, and signal strength detection modules could be used to help encode (or decode) the varying voltage levels which represent an analog signal. Another example of usage of this invention in real-world applications is in the modeling of digital ASIC input/output (I/O) cells. FIGS. 13–15 illustrate such an application. In this example, a differential I/O having pull down resistors on each of the bidirectional ports to the cell (PAD and PADN) is to be modeled in Verilog. The I/O has both a driver and a receiver section. The driver truth table 130, illustrated in FIG. 13, shows that the pull down resistors are enabled on PAD and PADN when the driver is off (rows a and b in FIG. 13). FIG. 14, which illustrates the receiver truth table 140, highlights a unique requirement in rows g and h. In particular, row g specifies that the receiver output (Z) is "X" when PAD=PADN=0. A different requirement for Z is shown in row h, where Z is 0 when PAD=PADN=L, where L in this case is "pull0." This requires detection of "pull0" signals in the Verilog I/O model.

FIG. 15 shows an implementation 150 of this requirement that uses two "PULL0DETECT" modules, which were described above with regard to FIG. 9. The use of the PULL0DECTECT modules greatly simplifies an otherwise moderately complex differential I/O. The PULL0DECTECT modules simply return a True/False result indicating whether their input is "L" or not (PAD and PADN in this case). Using this information, the crux of the model is contained in a 4:1 multiplexer (MUX41). The outputs from the PULL0DETECT modules driven by PAD and PADN are then fed into the MUX41 select lines as shown in line 152 of FIG. 15, which decode the entries in rows d l of the truth table in FIG. 14. All of the possible select line combinations are described below:

00: neither PAD nor PADN are "L" the muxOut1 signal is used which models the logic in rows d through g in FIG. 14.

01, 10: only one of either PAD or PADN is "L," but not both at the same time. Rows i through l in FIG. 14 are covered by these two select line combinations. A constant "X" (1'bx in the Verilog language) logic value is driven into the data lines to the 4:1 Mux for the 01 and 10 combinations to reflect the fact that the "Z" output is shown to go to "X" in rows i l.

11: PAD=PADN=L corresponding to row h in FIG. 14. The truth table 140 dictates the "Z" output in this case should be logic 0, hence the 1'b0 value for the data line corresponding to the "11" position in the MUX41. This is in contrast to row g which dictates that when PAD=PADN=0, the Z output should go to X.

It is understood that the systems, functions, mechanisms, methods, and modules described herein can be implemented in hardware, software, or a combination of hardware and software. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method for detecting signal strengths in a hardware description language, comprising:
   creating a wired net configuration that provides for a data input signal and a controlled reference signal, wherein the controlled reference signal has a logical value opposite that of the input signal;
   varying the controlled reference signal based on a desired signal strength to be detected, wherein the desired signal strength comprises a range of signal strengths, and wherein the controlled reference signal has a signal strength larger than the range of signal strengths; and
   comparing the input signal with the controlled reference signal to determine if the desired signal strength has been detected.

2. The method of claim 1, wherein the hardware description language comprises Verilog.

3. The method of claim 1, wherein the comparing further comprises:
   inputting the input signal and the controlled reference signal into a first wired net;
   resolving the first wired net to obtain a resolved value;
   inputting a signal corresponding to the input signal into a scalar net; and
   comparing the resolved value on the first wired net with the signal corresponding to the input signal on the scalar net to determine if the desired signal strength has been detected.

4. A method for detecting signal strengths in a hardware description language, comprising:
   creating a wired net configuration that provides for a data input signal and a controlled reference signal;
   varying the controlled reference signal based on a desired signal strength to be detected; and
   comparing the input signal with the controlled reference signal to determine if the desired signal strength has been detected;
   wherein the controlled reference signal has a logical value opposite that of the input signal, and wherein the controlled reference signal has a signal strength exactly opposite the desired signal strength to be detected.

5. A module for detecting signal strengths in a hardware description language, the module comprising:
   a first wired net for receiving an input signal and a controlled reference signal, wherein the hardware description language resolves the first wired net to obtain a resolved value, and wherein the controlled reference signal has a logical value opposite that of the input signal;

a scalar net for receiving a signal corresponding to the input signal; and a comparison system for comparing the resolved value on the first wired net with the signal corresponding to the input signal on the scalar net to determine if a desired signal strength has been detected, wherein the desired signal strength comprises a range of signal strengths, and wherein the controlled reference signal has a signal strength lamer than the range of signal strengths.

6. The module of claim 5, wherein the hardware description language comprises Verilog.

7. The module of claim 5, wherein the input signal is input into the first wired net via an isolating element.

8. The module of claim 5, wherein the controlled reference signal is provided via a buffer, wherein the input of the buffer is tied to one of a source voltage and ground.

9. The module of claim 5, wherein the signal corresponding to the input signal is produced by inputting the input signal into a buffer.

10. The module of claim 5, wherein the comparison system comprises a vector comparison block for comparing a vector composed of the resolved value on the first wired net and the signal corresponding to the input signal on the scalar net to a predetermined key combination.

11. The module of claim 5, wherein the desired signal strength is selected from the group consisting of: supply0, strong0, pull0, large0, weak0, medium0, small0, supply1, strong1, pull1, large1, weak1, medium1, and small1.

12. The module of claim 5, wherein the module is reusable, and wherein the desired signal strength is selected from the group consisting of: supply0, strong0, pull0, large0, weak0, medium0, small0, supply1, strong1, pull1, large1, weak1, medium1, small1, and ranges of signal strengths.

13. A module for detecting signal strengths in a hardware description language, the module comprising:

a first wired net for receiving an input signal and a controlled reference signal, wherein the hardware description language resolves the first wired net to obtain a resolved value, and wherein the controlled reference signal has a logical value opposite that of the input signal;

a scalar net for receiving a signal corresponding to the input signal; and a comparison system for comparing the resolved value on the first wired net with the signal corresponding to the input signal on the scalar net to determine if a desired signal strength has been detected, wherein the controlled reference signal has a signal strength exactly opposite the desired signal strength to be detected.

14. A program product stored on a recordable medium for detecting signal strengths, comprising:

program code for providing a first wired net for receiving an input signal and a controlled reference signal and for resolving the first wired net to obtain a resolved value, wherein the controlled reference signal has a logical value opposite that of the input signal;

program code for providing a scalar net for receiving a signal corresponding to the input signal; and program code for comparing the resolved value on the first wired net with the signal corresponding to the input signal on the scalar net to determine if a desired signal strength has been detected, wherein the desired signal strength comprises a range of signal strengths. and wherein the controlled reference signal has a signal strength larger than the range of signal strengths.

15. The program product of claim 14, wherein the hardware description language comprises Verilog.

16. The program product of claim 14, wherein the program code for comparing further comprises program code for comparing a vector composed of the resolved value on the first wired net and the signal corresponding to the input signal on the scalar net to a predetermined key combination.

17. A program product stored on a recordable medium for detecting signal strengths, comprising:

program code for providing a first wired net for receiving an input signal and a controlled reference signal and for resolving the first wired net to obtain a resolved value;

program code for providing a scalar net for receiving a signal corresponding to the input signal; and program code for comparing the resolved value on the first wired net with the signal corresponding to the input signal on the scalar net to determine if a desired signal strength has been detected, wherein the controlled reference signal has a logical value opposite that of the input signal, and wherein the controlled reference signal has a signal strength exactly opposite the desired signal strength to be detected.

* * * * *